(12) United States Patent
Worley

(10) Patent No.: US 8,213,142 B2
(45) Date of Patent: Jul. 3, 2012

(54) AMPLIFIER WITH IMPROVED ESD PROTECTION CIRCUITRY

(75) Inventor: Eugene R. Worley, Irvine, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 208 days.

(21) Appl. No.: 12/260,901

(22) Filed: Oct. 29, 2008

(65) Prior Publication Data

US 2010/0103572 A1  Apr. 29, 2010

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. .......................................... 361/56; 361/118
(58) Field of Classification Search ...................... 361/56
See application file for complete search history.

(56) References Cited

U.S. PATENT DOCUMENTS

| 4,037,140 | A | 7/1977 | Eaton, Jr. | |
| 6,426,665 | B2 | 7/2002 | Morishita | |
| 6,894,567 | B2 * | 5/2005 | Vickram et al. | 330/298 |
| 7,202,749 | B2 * | 4/2007 | Mohammadi | 330/307 |
| 7,233,467 | B2 * | 6/2007 | Mergens et al. | 361/56 |
| 7,298,213 | B2 * | 11/2007 | Kang | 330/283 |
| 7,649,722 | B2 * | 1/2010 | Thijs et al. | 361/56 |
| 2007/0058308 | A1 * | 3/2007 | Thijs et al. | 361/56 |
| 2007/0279106 | A1 * | 12/2007 | Bennett et al. | 327/110 |

OTHER PUBLICATIONS

International Search Report—PCT/US2009/062409- International Search Authority, European Patent Office, Mar. 8, 2010.
Thijs S et al: "Implementation of plug-and-play ESD protection in 5.5GHz 90nm RF CMOS LNAs-Concepts, constraints and solutions" Microelectronics and Reliability, Elsevier Science Ltd, GB, vol. 46, No. 5-6, May 1, 2006, pp. 702-712, XP025250281 ISSN: 0026-2714 [retrieved on May 11, 2006 p. 709, left-hand column, line 3—p. 711, left-hand column, line 6; figures 15, 20.
Yuan-Wen Hsiao et al: "An ESD-protected 5-GHz differential low-noise amplifier in a 130-nm CMOS process" Custom Integrated Circuits Conference, 2008. CICC 2008. IEEE, IEEE, Piscataway, NJ, USA, Sep. 21, 2008, pp. 233-236, XP031361452 ISBN: 978-1-4244-2018-6 p. 234, left-hand column, line 3—p. 236, right-hand column, line 21; figures 2,3,4.
Written Opinion—PCT/US2009/062409—ISA/EPO—Mar. 8, 2010.

* cited by examiner

*Primary Examiner* — Dharti Patel
(74) *Attorney, Agent, or Firm* — Ramin Mobarhan

(57) ABSTRACT

An amplifier (e.g., an LNA) with improved ESD protection circuitry is described. In one exemplary design, the amplifier includes a transistor, an inductor, and a clamp circuit. The transistor has a gate coupled to a pad and provides signal amplification for the amplifier. The inductor is coupled to a source of the transistor and provides source degeneration for the transistor. The clamp circuit is coupled between the gate and source of the transistor and provides ESD protection for the transistor. The clamp circuit may include at least one diode coupled between the gate and source of the transistor. The clamp circuit conducts current through the inductor to generate a voltage drop across the inductor when a large voltage pulse is applied to the pad. The gate-to-source voltage (Vgs) of the transistor is reduced by the voltage drop across the inductor, which may improve the reliability of the transistor.

25 Claims, 7 Drawing Sheets

US 8,213,142 B2

AMPLIFIER WITH IMPROVED ESD PROTECTION CIRCUITRY

BACKGROUND

I. Field

The present disclosure relates generally to electronics, and more specifically to an amplifier.

II. Background

Amplifiers are commonly used in various electronics devices to provide signal amplification. Different types of amplifiers are available for different uses. For example, a wireless communication device such as a cellular phone may include a transmitter and a receiver for bi-directional communication. The receiver may utilize a low noise amplifier (LNA), the transmitter may utilize a power amplifier (PA), and the receiver and transmitter may utilize variable gain amplifiers (VGAs).

Amplifiers may be fabricated with various integrated circuit (IC) processes. Sub-micron complementary metal oxide semiconductor (CMOS) fabrication processes are commonly used for radio frequency (RF) circuits in wireless devices and other electronics devices in order to reduce cost and improve integration. However, transistors fabricated with sub-micron CMOS processes typically have small physical dimensions and are more susceptible to stress and possibly failure due to electro-static discharge (ESD). ESD is a sudden large and momentary electrical charge that may come from static electricity and/or other sources. It is desirable to effectively combat ESD while minimally affecting performance.

DETAILED DESCRIPTION

The word "exemplary" is used herein to mean "serving as an example, instance, or illustration." Any design described herein as "exemplary" is not necessarily to be construed as preferred or advantageous over other designs.

Various exemplary designs of an amplifier with improved ESD protection circuitry are described herein. The amplifier may be used for various electronics devices such as wireless and wireline communication devices, cellular phones, personal digital assistants (PDAs), handheld devices, wireless modems, laptop computers, cordless phones, Bluetooth devices, etc. For clarity, the use of the amplifier for a wireless communication device is described below.

Figure 1:
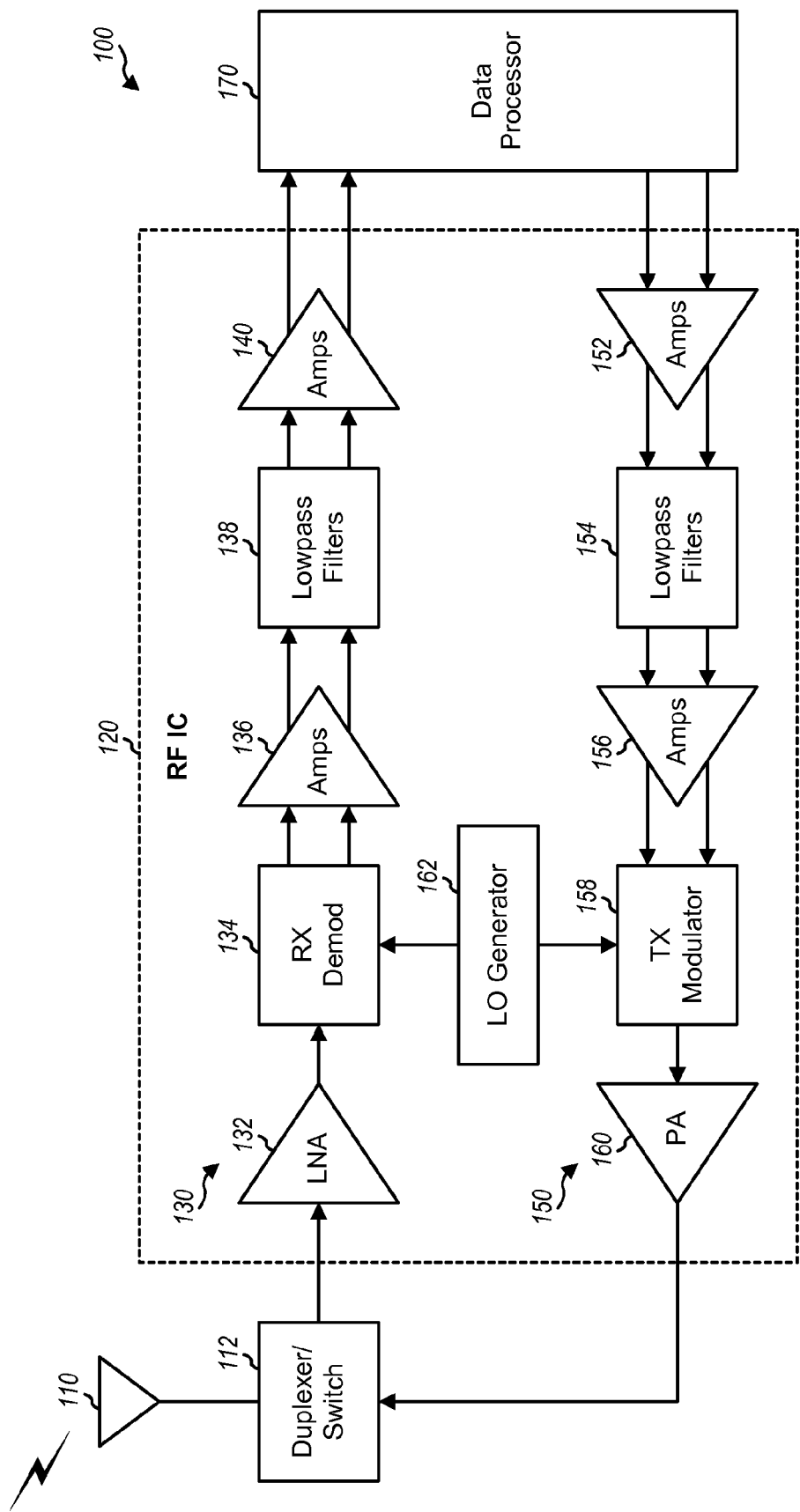
FIG. 1 shows a block diagram of a wireless communication device.

FIG. 1 shows a block diagram of a wireless communication device 100, which may be a cellular phone or some other device. In the exemplary design shown in FIG. 1, wireless device 100 includes a receiver 130 and a transmitter 150 that support bi-directional communication. In general, wireless device 100 may include any number of receivers and any number of transmitters for any number of communication systems and any number of frequency bands.

In the receive path, an antenna 110 receives signals transmitted by base stations and/or other transmitter stations and provides a received RF signal, which is routed through a duplexer/switch 112 and provided to receiver 130. Within receiver 130, the received RF signal is amplified by a low noise amplifier (LNA) 132 and demodulated by a receive demodulator (RX Demod) 134 to obtain inphase (I) and quadrature (Q) downconverted signals. The downconverted signals are amplified by amplifiers (Amps) 136, filtered by lowpass filters 138, and further amplified by amplifiers 140 to obtain I and Q input baseband signals, which are provided to a data processor 170.

In the transmit path, data processor 170 processes data to be transmitted and provides I and Q output baseband signals to transmitter 150. Within transmitter 150, the output baseband signals are amplified by amplifiers 152, filtered by lowpass filters 154, amplified by amplifiers 156, and modulated by a transmit (TX) modulator 158 to obtain a modulated signal. A power amplifier (PA) 160 amplifies the modulated signal to obtain a desired output power level and provides a transmit RF signal. The transmit RF signal is routed through duplexer/switch 112 and transmitted via antenna 110. A local oscillator (LO) signal generator 162 generates downconversion LO signals for demodulator 134 in receiver 130 and upconversion LO signals for modulator 158 in transmitter 150.

FIG. 1 shows an exemplary design of a transceiver. In general, the conditioning of the signals in a transmitter and a receiver may be performed by one or more stages of amplifier, filter, upconverter, downconverter, etc. The circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted.

In the exemplary design shown in FIG. 1, receiver 130 and transmitter 150 may be implemented on an RF integrated circuit (RFIC) 120. LNA 130 and amplifiers 152 may receive input signals from devices that are external to RFIC 120 and may thus have their inputs coupled to IC pins. These IC pins may be susceptible to ESD charges, which may damage the circuits coupled to the IC pins. LNA 130 and amplifier 152 may be implemented with ESD protection circuitry that can handle ESD charges coupled via the IC pins.

Figure 2:
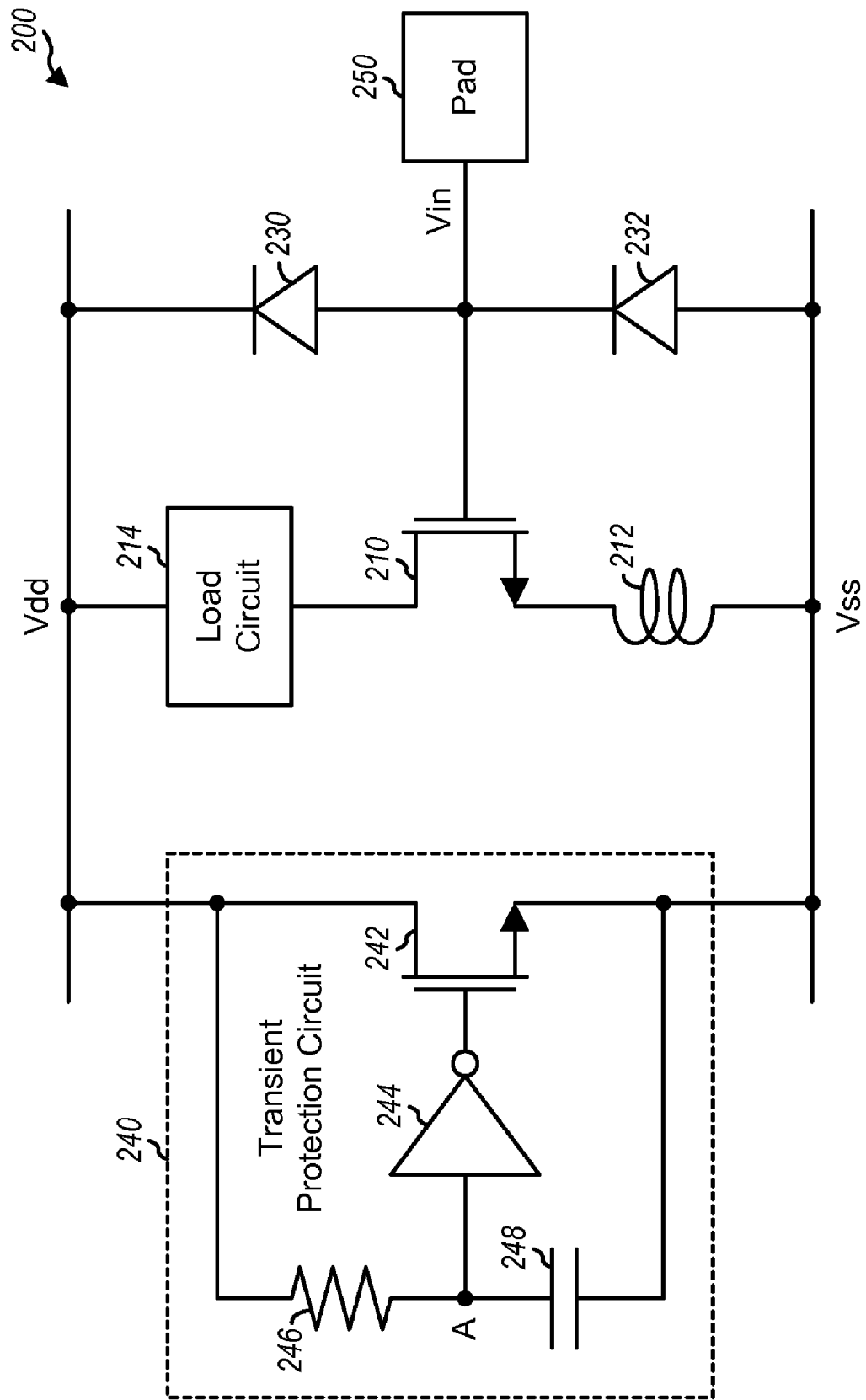
FIG. 2 shows an amplifier with ESD protection circuitry.

FIG. 2 shows a schematic diagram of an exemplary design of an amplifier 200 with ESD protection circuitry. Amplifier 200 may be used for LNA 132, amplifiers 152, and/or other circuit blocks in FIG. 1. For simplicity, FIG. 2 shows only an input portion of amplifier 200. Amplifier 200 may include other circuitry not shown in FIG. 2 for simplicity.

Within amplifier 200, an N-channel metal oxide semiconductor (NMOS) transistor 210 has its gate coupled to a pad 250, its source coupled to one end of an inductor 212, and its drain coupled to a load circuit 214. The terms "transistor" and "device" are often used interchangeably. The other end of inductor 212 is coupled to a lower supply voltage, Vss, which may be circuit ground. The other end of load circuit 214 is coupled to an upper supply voltage, Vdd. NMOS transistor 210 provides amplification for an input signal, Vin, received via pad 250. NMOS transistor 210 may be implemented with thin gate oxide in order to obtain good performance at high frequency. The use of thin gate oxide may result in a lower operating voltage and a lower breakdown voltage for NMOS transistor 210. Inductor 212 provides source degeneration for NMOS transistor 210, which may improve the linearity of amplifier 200. Inductor 212 may also provide an impedance match looking into the gate of NMOS transistor 210.

The ESD protection circuitry for amplifier 200 includes diodes 230 and 232 and a transient protection circuit 240.

Diode 230 has its anode coupled to pad 250 and its cathode coupled to Vdd. Diode 232 has its anode coupled to Vss and its cathode coupled to pad 250. Diodes 230 and 232 may be implemented with shallow trench isolation (STI) diodes having less capacitance (which may improve the performance of amplifier 200) but slower turn-on speed. Transient protection circuit 240 includes an NMOS transistor 242 having its source coupled to Vss and its drain coupled to Vdd. An inverter 244 has its input coupled to node A and its output coupled to the gate of NMOS transistor 242. A resistor 246 is coupled between node A and Vdd. A capacitor 248 is coupled between node A and Vss. NMOS transistor 242 may be a large field effect transistor (FET) that can conduct a large amount of current when turned on.

The ESD protection circuitry shown in FIG. 2 is designed to handle large positive and negative ESD current pulses applied to pad 250. ESD current pulses may be applied to an IC package that contains amplifier 200, with no power supply voltage present. During normal operation, capacitor 248 is charged to Vdd, the output of inverter 244 is at logic low, and NMOS transistor 242 is turned off. A fast rising large positive ESD current pulse may be applied to pad 250 with respect to Vss while the IC package containing amplifier 200 is being handled. The large ESD current pulse forward biases diode 230, which steers the current into transient protection circuit 240 and pulls up Vdd. When Vdd is pulled sufficiently high, the output of inverter 244 transitions to logic high and turns on NMOS transistor 242. NMOS transistor 242 has a low on resistance when turned on and provides a conducting path for the current from the large positive ESD current pulse. Conversely, when a large negative ESD current pulse is applied to pad 250, diode 232 is turned on and provides a conducting path for the current from this ESD current pulse while dropping a relatively small voltage that is not damaging to other circuits. The ESD protection circuitry may be designed such that voltage drops due to ESD current pulses are not large enough to damage internal circuits as well as the ESD protection circuitry itself.

A charged device model (CDM) test may be performed to determine the ability of a device to withstand electrostatic charges. For the CDM test, an IC chip may be mounted on a field plate and charged to a large voltage (e.g., 500 Volts (V)) with respect to the field plate. A pin on the IC chip may then be shorted to the field plate via a test probe, and a large electrostatic charge may be provided via this IC pin. The CDM test thus tests the ability of the IC chip to withstand an electrostatic charge that is stored on the IC chip and subsequently discharged due to contact with a metallic object. This type of discharge is a common type of ESD and causes most of the ESD damage in IC chips.

Figure 3:
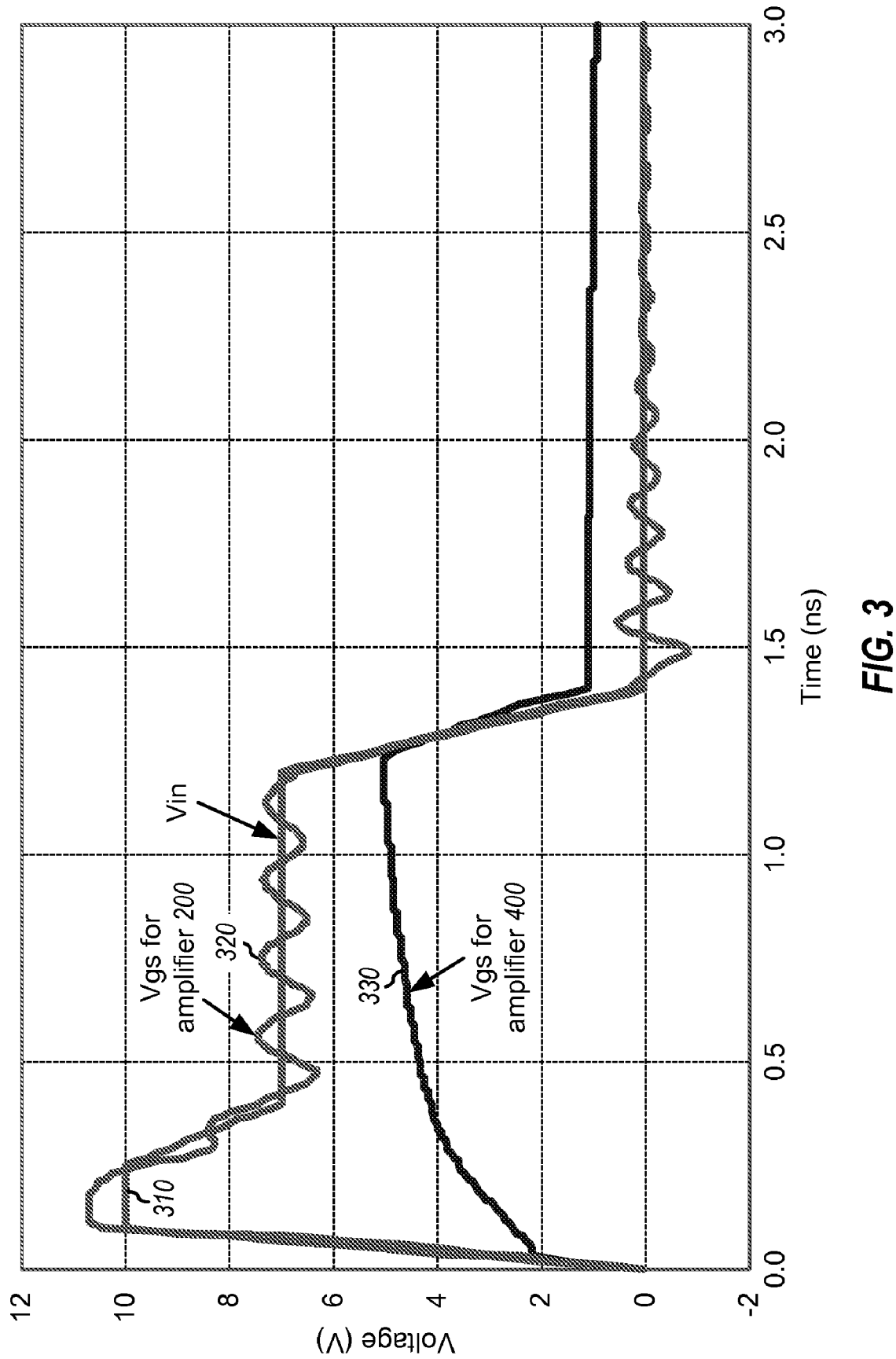
FIG. 3 shows plots of various voltages for an ESD test.

CDM testing was performed on amplifier 200 in FIG. 2. The CDM testing revealed that the gate oxide between the gate and source of NMOS transistor 210 would rupture for CDM voltages well below a desired value. The gate to drain oxide did not rupture, and this may be due to load circuit 214 providing some protection for the gate to drain oxide by absorbing some of the voltage drop. The ESD protection circuitry composed of diodes 230 and 232 and transient protection circuit 240 was only partially effective at protecting the thin gate oxide of NMOS transistor 210. A major problem with the ESD protection circuitry shown in FIG. 3 is due to the use of STI diodes for diodes 230 and 232. The STI diodes were slow to respond to a very fast CDM current pulse, which may rise as fast as 100 pico-seconds (ps). The slow response time of the STI diodes to this fast rise time causes an initial voltage spike to appear on pad 250.

FIG. 3 shows exemplary plots of an input voltage (Vin) at pad 250 and a gate-to-source voltage (Vgs) of NMOS transistor 210 for a CDM test. In this CDM test, a large electrostatic charge is modeled by a very fast pulse generator having a source resistance of approximately 0.5 Ohms. The pulse generator provides a large voltage pulse shown by a plot 310. The large voltage pulse has a rise time of 100 ps to a peak voltage of 10V, then remains at 10V until 250 ps, and then drops from 10V down to 7V at 400 ps. The initial peak voltage approximates a spike at pad 250 due to the large electrostatic charge. The large voltage pulse remains at 7V until 1.2 nanoseconds (ns), then drops from 7V down to 0V at 1.4 ns, and then remains at 0V. The 7V from 400 ps to 1.2 ns may be due to a Vdd voltage of 5V and a voltage drop of approximately 2V across diode 230 with high current.

The CDM test assumed that the input voltage from pad 250 to Vss is limited to 10V due to the ESD protection circuitry. Test measurements showed that diode 230 is fully turned on at about 400 ps. After 400 ps, diode 230 maintains a voltage of 7V at pad 250.

The Vgs voltage of NMOS transistor 210 is shown by a plot 320. The Vgs voltage generally follows the large voltage pulse and further contains ringing due to inductor 212. The ringing causes the peak Vgs voltage to reach 10.7V during the initial spike. For the exemplary design shown in FIG. 2, the gate oxide of NMOS transistor 250 would rupture if a high voltage of 7V is applied for more than 1 ns between the gate and source of NMOS transistor 210, which is the case shown in FIG. 3. The gate oxide may be very sensitive to voltage and may easily rupture for voltages greater than 7V even if the pulse duration time is short.

In general, a time dependent dielectric breakdown (TDDB) of a thin NMOS gate oxide may be given by:

$$TDDB = \left(\frac{V_{ox}}{0.24 \cdot T_{ox} + 2.1}\right)^{-30}, \qquad \text{Eq (1)}$$

where TDDB is the time to oxide breakdown in nanoseconds (ns),

Vox is a gate oxide voltage with respect to body, drain, and source, and

Tox is a gate oxide thickness in Angstrom (Å).

Equation (1) may be valid for gate oxide thickness within a range of 11 to 27 Å.

Equation (1) indicates that the amount of time before rupture of the gate oxide of an NMOS transistor may be highly dependent on the Vgs voltage and the thickness of the gate oxide.

Rupture of the gate oxide due to CDM testing may be avoided by using other amplifier configurations. However, these other amplifier configurations may provide inferior performance and/or may have other shortcomings in comparison to the amplifier configuration shown in FIG. 2.

Brute force clamping with diodes 230 and 232 may be used for the amplifier configuration shown in FIG. 2 but may only be partially effective, especially if NMOS transistor 210 is a thin-oxide transistor fabricated with a submicron CMOS process. Furthermore, a high peak voltage may be present if the turn-on speed of clamping diodes 230 and 232 is not sufficiently fast, as shown in FIG. 3. Faster diodes may be used to obtain faster turn-on speed, but these faster diodes may have larger capacitance per micron of stripe length, which may be undesirable from a performance perspective.

More effective clamping may be achieved by (i) inserting a resistor between the gate of NMOS transistor 210 and pad 250 and (ii) connecting one pair of clamping diodes 230 and 232 to each side of this resistor. However, a resistor at the gate of NMOS transistor 210 would increase noise, which may be highly undesirable if amplifier 200 is used for an LNA.

In an aspect, improved ESD protection may be achieved with a clamp circuit coupled between the gate and source of a NMOS transistor having a source degeneration inductor. The clamp circuit may steer the ESD current through the inductor, and the steered current would result in a voltage drop across the inductor. The Vgs of the NMOS transistor would be reduced by the amount of voltage drop across the inductor.

Figure 4A:
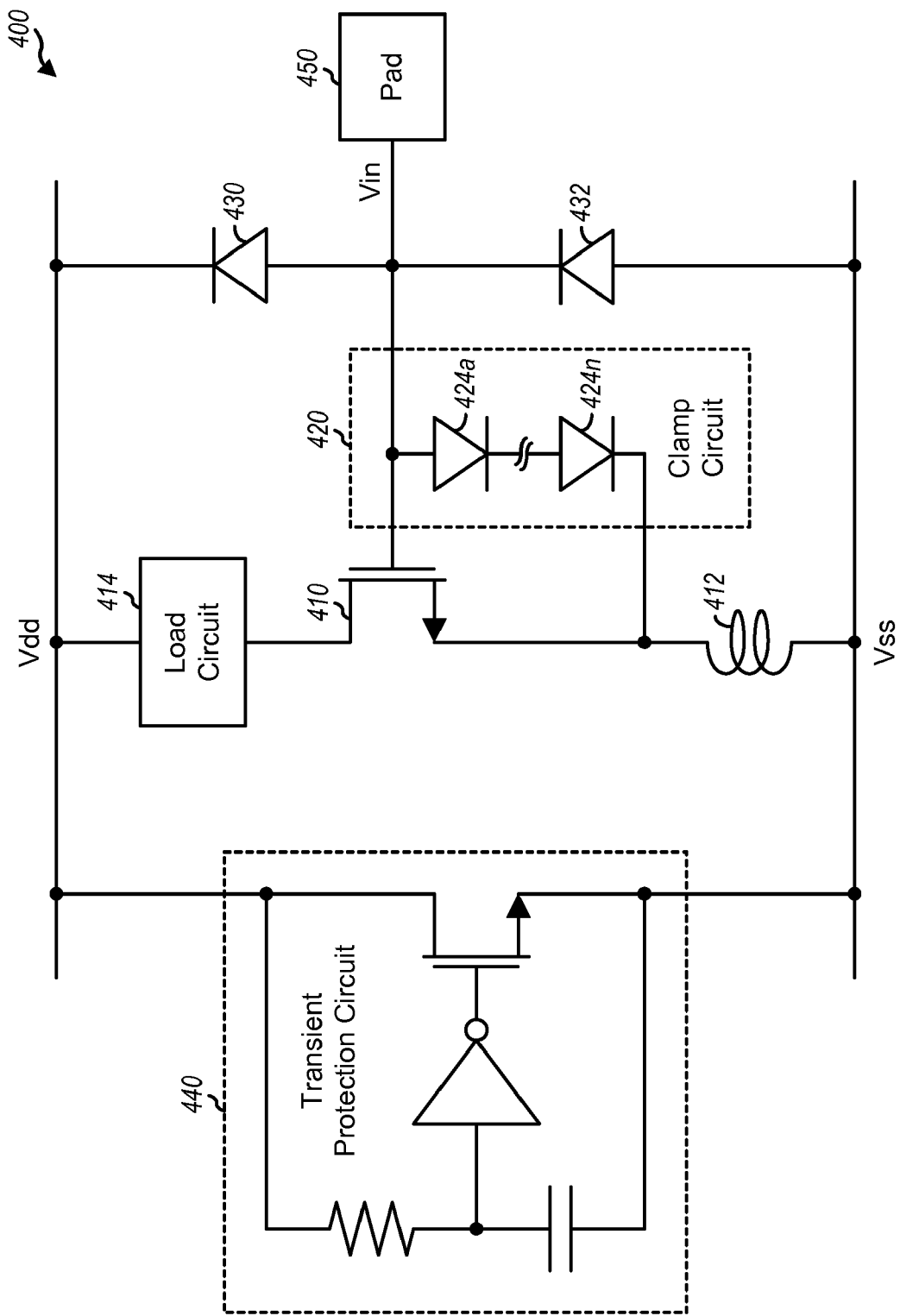
FIGS. 4A and 4B show two exemplary designs of an amplifier with improved ESD protection circuitry.

FIG. 4A shows a schematic diagram of an exemplary design of an amplifier 400 with improved ESD protection circuitry. Amplifier 400 may be used for LNA 132, amplifier 152, and/or other circuit blocks in FIG. 1. Amplifier 400 includes an NMOS transistor 410 having its gate coupled to a pad 450, its source coupled to a source degeneration inductor 412, and its drain coupled to a load circuit 414. The other end of inductor 412 is coupled to Vss, and the other end of load circuit 414 is coupled to Vdd.

The ESD protection circuitry for amplifier 400 includes diodes 430 and 432 and a transient protection circuit 440, which are coupled in the same manner as diodes 230 and 232 and transient protection circuit 240 in FIG. 2. The ESD protection circuitry further includes a clamp circuit 420 coupled between the gate and source of NMOS transistor 410. In the exemplary design shown in FIG. 4A, clamp circuit 420 includes N diodes 424a through 424n coupled in series, where N may be one or greater. Each diode 424 has its cathode coupled to the anode of the next diode. The first diode 424a has its anode coupled to the gate of NMOS transistor 410, and the last diode 424n has its cathode coupled to the source of NMOS transistor 410.

Clamp circuit 420 can combat a large positive voltage pulse applied to pad 450. During normal operation, the voltage drop across inductor 412 is small, and the source of NMOS transistor 410 is close to Vss. When a large positive voltage pulse is applied to pad 450, diodes 424a through 424n conduct current into inductor 412. A voltage drop is developed across inductor 412 and may be expressed as:

$$Vind = L \cdot \frac{di}{dt}, \quad \text{Eq (2)}$$

where L is the inductance of inductor 412,
di/dt is the rate of change of the current flowing through inductor 412, and
Vind is the voltage drop across inductor 412.

For a large electrostatic charge, di/dt may be on the order of amperes over about one hundred picoseconds and may thus be large. L may be dependent on the desired performance of amplifier 400 and may be on the order of nanoHenries (nH). Thus, a relatively large voltage drop on the order of Volts may be developed across inductor 412.

As shown in FIG. 4A, the input voltage is equal to the Vgs voltage of NMOS transistor 410 plus the voltage drop across inductor 412. The voltage drop across inductor 412 thus reduces the Vgs voltage across the gate and source of NMOS transistor 410. The Vgs voltage may be expressed as:

$$Vgs = Vin - Vind. \quad \text{Eq (3)}$$

FIG. 3 shows a plot 330 of the Vgs voltage of NMOS transistor 410 with the use of clamp circuit 420 in FIG. 4A. The CDM test performed on amplifier 200 in FIG. 2 and described above for FIG. 3 was also performed on amplifier 400 in FIG. 4A. By conducting current through diodes 424a through 424n in clamp circuit 420, the peak Vgs voltage of NMOS transistor 410 reduces to about 4.4V during the initial 500 ps of the large voltage pulse. By reducing the Vgs voltage from about 7V and a peak voltage of about 10.7 V for amplifier 200 down to a maximum voltage of about 4.4V for amplifier 400, rupture of the gate oxide of NMOS transistor 410 can be avoided.

Referring back to FIG. 4A, a sufficient number of diodes 424 may be coupled in series in order to avoid turning on these diodes during normal operation. In general, the number of diodes 424 to use may be determined based on a bias voltage for the gate of NMOS transistor 410 and a worst-case forward biased voltage for each diode 424 for a target leakage current or lower. For example, two diodes may be coupled in series if the maximum gate bias voltage is 0.6V for NMOS transistor 410 and if the worst-case forward biased voltage is 0.3V for each diode. During normal operation, the forward biased voltage across each diode may be well below the on condition, which may be about 0.5V at high temperature. More than two diodes may be coupled in series for a larger gate bias voltage.

Diodes 424 may be designed with a small size in order to minimize the effect of these diodes on the operation of NMOS transistor 410. Diodes 424 may be able to conduct a large amount of current for a short time duration even with the small size.

Diodes 424 may be implemented with various types of diodes such as STI diodes, gated diodes, etc. STI diodes may have less capacitance but may also have slower turn-on speed. Gated diodes may have faster turn-on speed but higher capacitance. In an exemplary design, diodes 424 may be implemented with gated diodes to obtain faster turn-on speed. The additional capacitance due to the faster gated diodes may marginally impact the performance of NMOS transistor 410 since these diodes are coupled between the gate and source of NMOS transistor 410 instead of between the source and Vss. The use of faster gated diodes for diodes 424 can more quickly route ESD current into inductor 412, thereby causing a large initial voltage drop across the inductor and a small Vgs drop across NMOS transistor 410. The use of faster gated diodes for diodes 424 may also allow diodes 430 and 432 to be implemented with slower STI diodes, which may result in lower capacitance at pad 450 and having better amplifier performance. A voltage spike may result from the use of slower STI diodes for diodes 430 and 432, as shown by plot 320 in FIG. 3. However, this voltage spike may be compensated by the fast turn-on speed of the gated diodes for diodes 424, and the voltage spike may be split between the voltage drop across inductor 412 and the Vgs voltage of NMOS transistor 410.

Figure 4B:
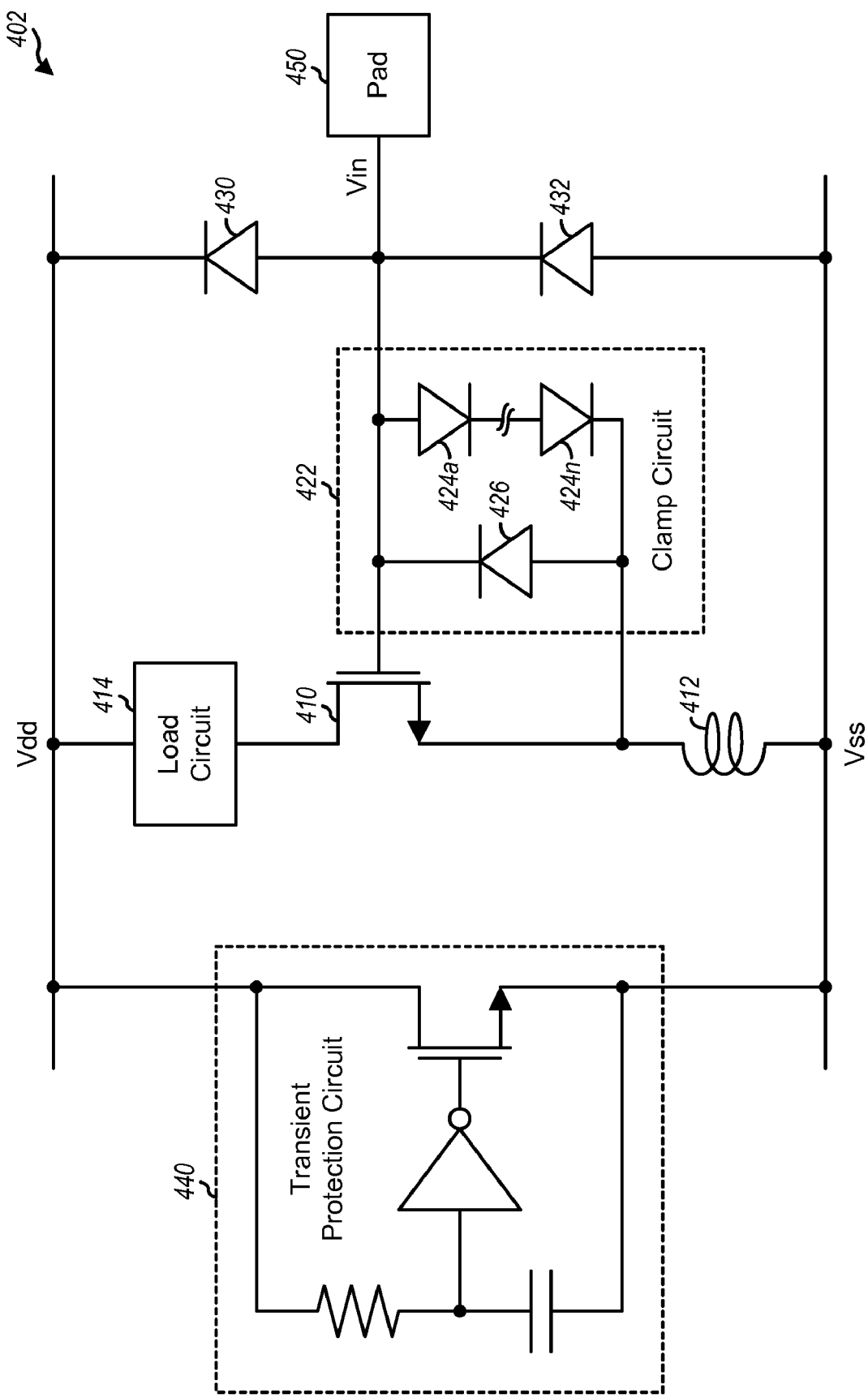

FIG. 4B shows a schematic diagram of an exemplary design of an amplifier 402 with improved ESD protection circuitry. Amplifier 402 may also be used for LNA 132, amplifier 152, and/or other circuit blocks in FIG. 1. Amplifier 402 includes all circuit components of amplifier 400 in FIG. 4A, albeit with clamp circuit 420 in amplifier 400 being replaced with clamp circuit 422 in amplifier 402.

In the exemplary design shown in FIG. 4B, clamp circuit 422 includes N diodes 424a through 424n coupled in series and between the gate and source of NMOS transistor 410. Clamp circuit 422 further includes a diode 426 having its anode coupled to the source of NMOS transistor 410 and its cathode coupled to the gate of the NMOS transistor.

Clamp circuit 420 can combat large positive and negative voltage pulses applied to pad 450. A large positive voltage pulse applied to pad 450 may be handled by diodes 424a through 424n, as described above for FIG. 4A. When a large negative voltage pulse is applied to pad 450, diode 426 draws current from source degeneration inductor 412. A negative voltage drop is then developed across inductor 412, as shown by equation (2). The input voltage is equal to the Vgs voltage of NMOS transistor 410 plus the voltage drop across inductor 412. The voltage drop across inductor 412 thus reduces the Vgs voltage across the gate and source of NMOS transistor 410, as shown in equation (3). The Vgs voltage may thus be reduced by diode 426, and the lower Vgs voltage may avoid rupture of the gate oxide of NMOS transistor 410.

Diode 426 may be implemented with the considerations described above for diodes 424. Diode 426 may have a sufficiently small size in order to reduce impact to the operation of NMOS transistor 410. Diode 426 may be implemented with a gated diode in order to achieve faster turn-on speed. This may allow diode 432 to be implemented with an STI diode, which may reduce capacitance at the gate of NMOS transistor 410. Diode 426 may also be implemented with other types of diodes.

Figure 5:
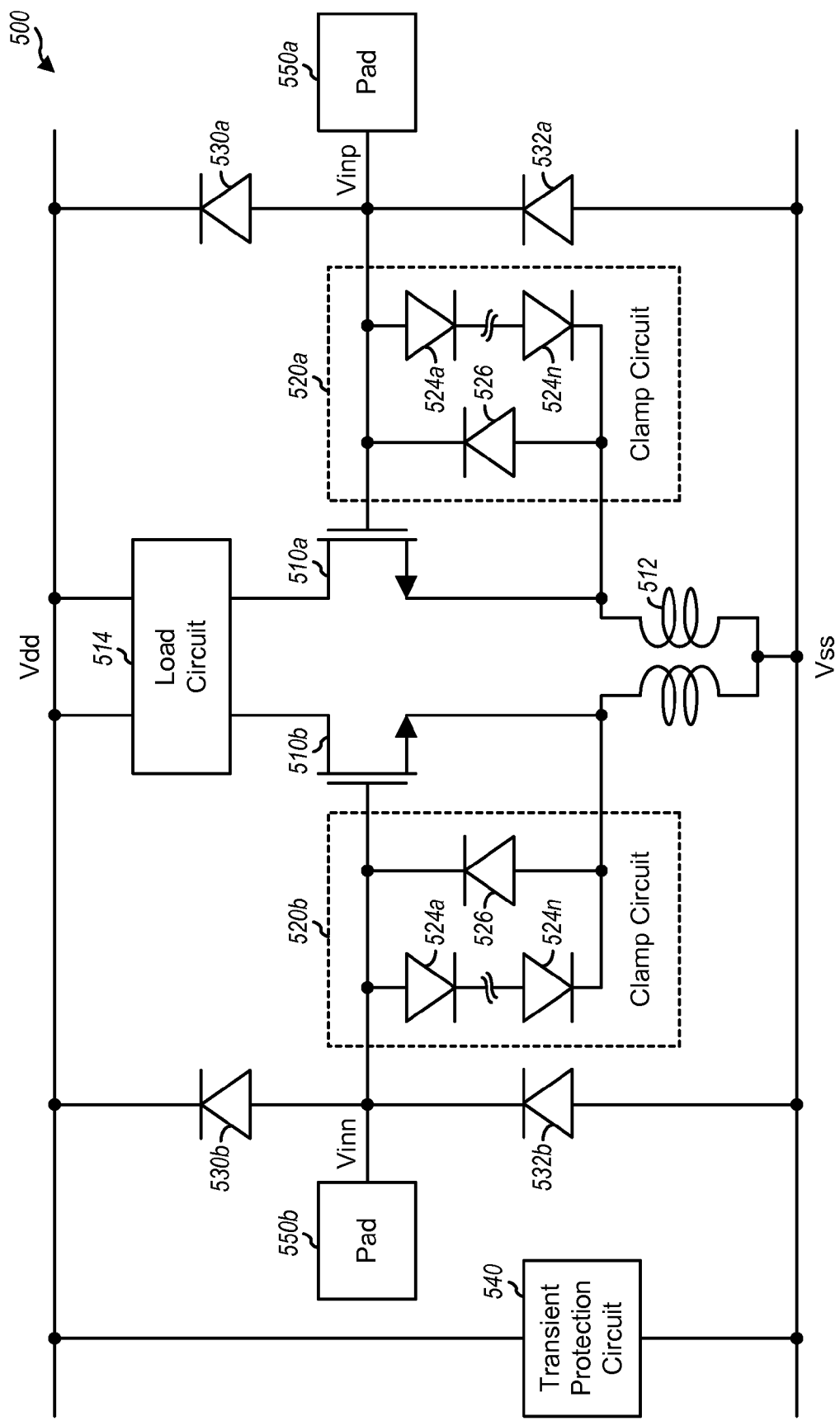
FIG. 5 shows a differential amplifier with improved ESD protection circuitry.

FIG. 5 shows a schematic diagram of an exemplary design of a differential amplifier 500 with improved ESD protection circuitry. Amplifier 500 may also be used for LNA 132, amplifier 152, and/or other circuit blocks in FIG. 1. Amplifier 500 includes a differential pair composed of NMOS transistors 510a and 510b having their gates coupled to pads 550a and 550b, respectively, their sources coupled to two ends of a differential transformer 512, and their drains coupled to a load circuit 514. The other ends of transformer 512 are coupled to Vss, and the other ends of load circuit 514 are coupled to Vdd.

The ESD protection circuitry for amplifier 500 includes clamp circuits 520a and 520b, diodes 530a, 530b, 532a and 532b, and a transient protection circuit 540. Clamp circuit 520a is coupled between the gate and source of NMOS transistor 510a, and clamp circuit 520b is coupled between the gate and source of NMOS transistor 510b. Each clamp circuit 520 includes (i) N diodes 524a through 524n coupled in series, with the anode of the first diode 524a coupled to the gate of NMOS transistor 510 and the cathode of the last diode 524n coupled to the source of NMOS transistor 510, and (ii) a diode 526 having its anode coupled to the source of NMOS transistor 510 and its cathode coupled to the gate of NMOS transistor 510. Diodes 530a and 532a are coupled between Vdd, pad 550a, and Vss. Diodes 530b and 532b are coupled between Vdd, pad 550b, and Vss. Transient protection circuit 540 is coupled between Vdd and Vss and may be implemented in the same manner as transient protection circuit 240 in FIG. 2.

The ESD protection circuitry for amplifier 500 can combat large positive and negative voltage pulses applied to pads 550a and 550b. A large positive voltage pulse applied to pad 550a (or pad 550b) may be handled by diode 530a (or diode 530b) and transient protection circuit 540 as well as diodes 524a through 524n in clamp circuit 520a (or clamp circuit 520a), as described above for FIG. 4A. A large negative voltage pulse applied to pad 550a (or pad 550b) may be handled by diode 532a (or diode 532b) as well as diode 526 in clamp circuit 520a (or clamp circuit 520a), as described above for FIG. 4B.

FIGS. 4A, 4B and 5 show exemplary designs of an amplifier using an NMOS transistor. An amplifier may also be implemented using a P-channel MOS (PMOS) transistor or other types of transistor.

The improved ESD protection circuitry described herein uses relatively small diodes coupled between the gate and source of an input NMOS transistor to greatly enhance the protection of the gate oxide of the NMOS transistor. The small diodes act as a secondary clamp that can lower the voltage drop across the gate oxide of the NMOS transistor for high-speed voltage pulses while keeping the capacitance between the pad and Vss low. The small diodes may have negligible effect on the normal operation of an amplifier.

In general, an apparatus may comprise a transistor, an inductor, and a clamp circuit. The transistor may have a gate coupled to a pad and may provide signal amplification for an amplifier, e.g., an LNA. The transistor may be an NMOS transistor, a PMOS transistor, or some other type of transistor. The inductor is coupled to a source of the transistor and provides source degeneration for the transistor. The clamp circuit is coupled between the gate and source of the transistor and provides ESD protection for the transistor.

The clamp circuit may source current into the inductor to generate a positive voltage drop across the inductor when a large positive voltage pulse is applied to the pad. The clamp circuit may also draw current from the inductor to generate a negative voltage drop across the inductor when a large negative voltage pulse is applied to the pad. In both cases, the Vgs voltage of the transistor may be reduced by the voltage drop across the inductor.

The clamp circuit may comprise at least one diode coupled between the gate and source of the transistor. In one exemplary design, the at least one diode may comprise multiple diodes (e.g., diodes 424a through 424n in FIGS. 4A and 4B) coupled in series and comprising first and last diodes. The first diode may have an anode coupled to the gate of the transistor, and the last diode may have a cathode coupled to the source of the transistor. In another exemplary design, the at least one diode may comprise a diode (e.g., diode 426 in FIG. 4B) having an anode coupled to the source of the transistor and a cathode coupled to the gate of the transistor. For all designs, the at least one diode may be implemented with at least one gated diode or some other diode having fast turn-on speed.

The apparatus may further comprise first and second diodes (e.g., diodes 430 and 432 in FIGS. 4A and 4B). The first diode may be coupled between the pad and an upper power supply and may conduct current when a large positive voltage pulse is applied to the pad. The second diode may be coupled between the pad and a lower power supply and may conduct current when a large negative voltage pulse is applied to the pad. The first and second diodes may be implemented with STI diodes or some other type of diodes having less capacitance. The apparatus may further comprise a transient protection circuit (e.g., transient protection circuit 440 in FIGS. 4A and 4B), which may be coupled between the upper and lower power supplies and may conduct current when a large transient is present on the upper power supply.

The apparatus may further comprise a second transistor, a second inductor, and a second clamp circuit, e.g., as shown in FIG. 5. The second transistor may have a gate coupled to a second pad, and the two transistors may form a differential pair for the amplifier. The second inductor may be coupled to a source of the second transistor, and the two inductors may be part of a differential transformer. The second clamp circuit may be coupled between the gate and source of the second transistor.

In one exemplary design, an integrated circuit comprises an NMOS transistor, an inductor, and at least one diode. The NMOS transistor has a gate coupled to a pad and provides signal amplification for an amplifier, e.g., an LNA. The inductor is coupled between a source of the NMOS transistor and a lower supply voltage and provides source degeneration for the NMOS transistor. The at least one diode is coupled between the gate and source of the NMOS transistor and provides ESD protection for the NMOS transistor.

In one exemplary design, the at least one diode comprises multiple diodes coupled in series and comprising first and last diodes. The first diode may have an anode coupled to the gate of the NMOS transistor, and the last diode may have a cathode coupled to the source of the NMOS transistor. In another exemplary design, the at least one diode comprises a diode having an anode coupled to the source of the NMOS transistor and a cathode coupled to the gate of the NMOS transistor.

The integrated circuit may further comprise first and second diodes. The first diode (e.g., diode 430) may be coupled between the pad and an upper power supply and may conduct current when a large positive voltage pulse is applied to the pad. The second diode (e.g., diode 432) may be coupled between the pad and a lower power supply and may conduct current when a large negative voltage pulse is applied to the pad. The at least one diode may have faster turn-on speed than the first and second diodes. In one exemplary design, the at least one diode may be implemented with at least one gated diode, and the first and second diodes may be implemented with STI diodes.

Figure 6:
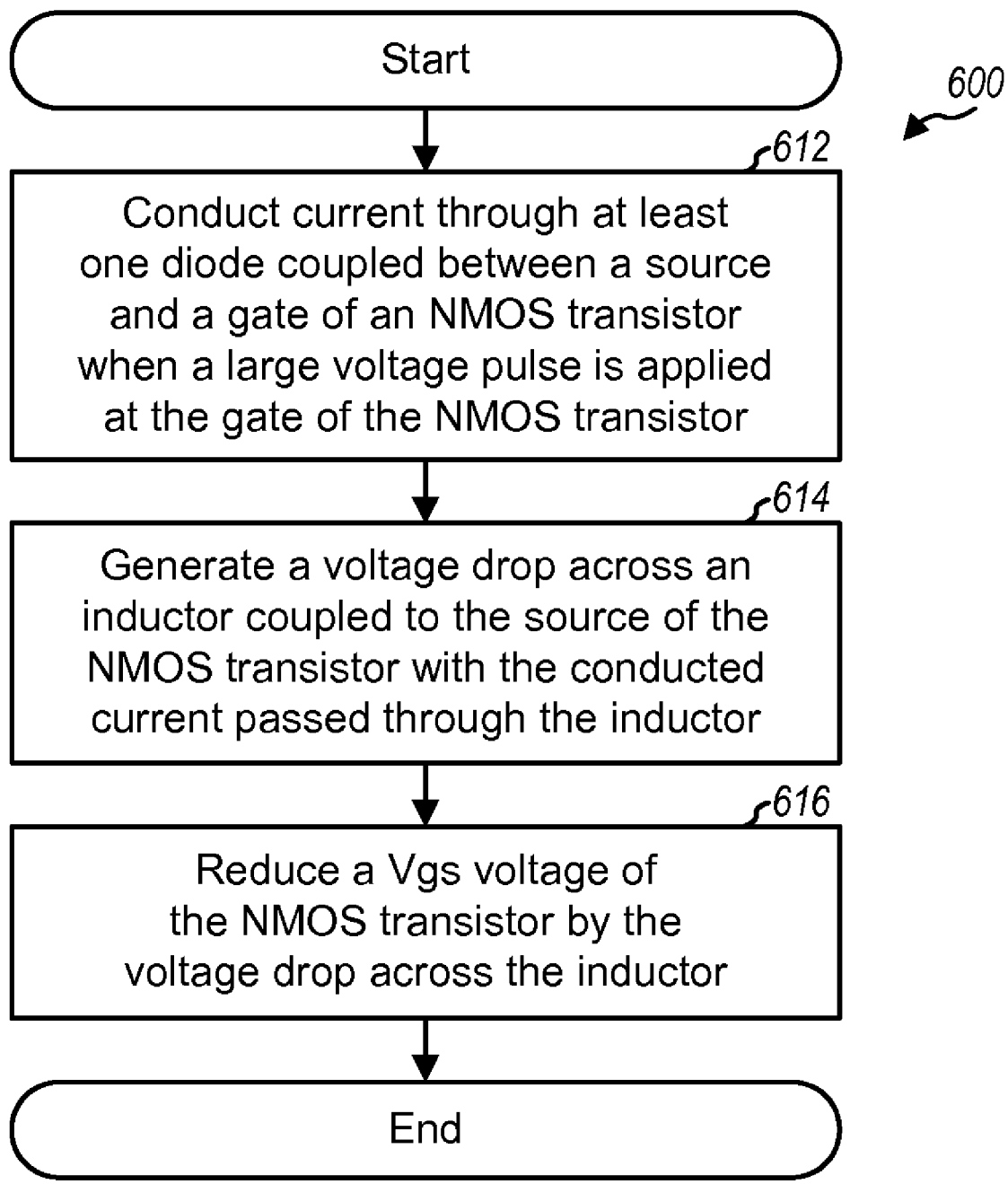
FIG. 6 shows a process for providing ESD protection.

FIG. 6 shows an exemplary design of a process 600 for providing ESD protection. Current may be conducted through at least one diode coupled between a source and a gate of an NMOS transistor when a large voltage pulse is applied at the gate of the NMOS transistor (block 612). A voltage drop may be generated across an inductor coupled to the source of the NMOS transistor with the conducted current passed through the inductor (block 614). The large voltage pulse may be a large positive voltage pulse, and the at least one diode may source current into the inductor to generate a positive voltage drop across the inductor. Alternatively, the large voltage pulse may be a large negative voltage pulse, and the at least one diode may draw current from the inductor to generate a negative voltage drop across the inductor. In either case, the Vgs voltage of the NMOS transistor may be reduced by the voltage drop across the inductor (block 616).

The amplifier with improved ESD protection circuitry described herein may be implemented on an IC, an analog IC, an RFIC, a mixed-signal IC, an application specific integrated circuit (ASIC), a printed circuit board (PCB), an electronics device, etc. The amplifier may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a transistor having a gate coupled to a pad;
    an inductor coupled to a source of the transistor; and
    a clamp circuit having one end coupled to the gate and another end coupled between the source of the transistor and the inductor and configured to conduct current from the gate to the inductor and from the inductor to the gate to provide electro-static discharge (ESD) protection for the transistor.

2. The apparatus of claim 1, the clamp circuit sourcing current into the inductor to generate a positive voltage drop across the inductor when a large positive voltage pulse is applied to the pad.

3. The apparatus of claim 1, the clamp circuit drawing current from the inductor to generate a negative voltage drop across the inductor when a large negative voltage pulse is applied to the pad.

4. The apparatus of claim 1, the transistor comprising an N-channel metal oxide semiconductor (NMOS) transistor.

5. The apparatus of claim 1, the clamp circuit comprising at least one diode coupled between the gate and source of the transistor.

6. The apparatus of claim 5, the at least one diode being implemented with at least one gated diode.

7. The apparatus of claim 1, the clamp circuit comprising multiple diodes coupled in series and comprising first and last diodes, the first diode having an anode coupled to the gate of the transistor, and the last diode having a cathode coupled to the source of the transistor.

8. The apparatus of claim 7, the transistor comprising an N-channel metal oxide semiconductor (NMOS) transistor providing signal amplification for a low noise amplifier (LNA), the inductor providing source degeneration for the NMOS transistor, and the multiple diodes providing ESD protection for the NMOS transistor.

9. The apparatus of claim 1, the clamp circuit comprising a diode having an anode coupled to the source of the transistor and a cathode coupled to the gate of the transistor.

10. The apparatus of claim 1, further comprising:
a first diode coupled between the pad and an upper power supply and conducting current when a large positive voltage pulse is applied to the pad; and
a second diode coupled between the pad and a lower power supply and conducting current when a large negative voltage pulse is applied to the pad.

11. The apparatus of claim 10, further comprising:
a transient protection circuit coupled between the upper and lower power supplies and conducting current when a large transient is present on the upper power supply.

12. The apparatus of claim 10, the first and second diodes being implemented with shallow trench isolation (STI) diodes.

13. The apparatus of claim 1, further comprising:
a second transistor having a gate coupled to a second pad;
a second inductor coupled to a source of the second transistor; and
a second clamp circuit coupled between the gate and source of the second transistor, the transistor and the second transistor forming a differential pair for an amplifier, the inductor and the second inductor being part of a differential transformer.

14. An integrated circuit comprising:
an N-channel metal oxide semiconductor (NMOS) transistor having a gate coupled to a pad;
an inductor coupled between a source of the NMOS transistor and a lower supply voltage; and
at least one diode having one end coupled to the gate and another end coupled between the source of the NMOS transistor and the inductor and configured to conduct current from the gate to the inductor and from the inductor to the gate to provide electro-static discharge (ESD) protection for the NMOS transistor.

15. The integrated circuit of claim 14, the at least one diode comprising
multiple diodes coupled in series and comprising first and last diodes, the first diode having an anode coupled to the gate of the NMOS transistor, and the last diode having a cathode coupled to the source of the NMOS transistor.

16. The integrated circuit of claim 14, the at least one diode comprising
a diode having an anode coupled to the source of the NMOS transistor and a cathode coupled to the gate of the NMOS transistor.

17. The integrated circuit of claim 14, further comprising:
a first diode coupled between the pad and an upper power supply and conducting current when a large positive voltage pulse is applied to the pad; and
a second diode coupled between the pad and the lower power supply and conducting current when a large negative voltage pulse is applied to the pad.

18. The integrated circuit of claim 17, the at least one diode having faster turn-on speed than the first and second diodes.

19. The integrated circuit of claim 17, the at least one diode having smaller size than the first and second diodes.

20. The integrated circuit of claim 17, the at least one diode being implemented with at least one gated diode, and the first and second diodes being implemented with shallow trench isolation (STI) diodes.

21. The integrated circuit of claim 14, the NMOS transistor providing signal amplification for a low noise amplifier (LNA), and the inductor providing source degeneration for the NMOS transistor.

22. A method comprising:
conducting current from a gate of an N-channel metal oxide semiconductor (NMOS) transistor to a source of the NMOS transistor and from the source to the gate through a plurality of diodes coupled between the gate and the source when a large voltage pulse is applied at the gate of the NMOS transistor;
generating a voltage drop across an inductor coupled between the at least one diode and a supply voltage with the conducted current passed through the inductor; and
reducing a gate-to-source voltage (Vgs) of the NMOS transistor by the voltage drop across the inductor.

23. The method of claim 22, the large voltage pulse being a large positive voltage pulse, and the conducting current comprising sourcing current through at least one of the plurality of diodes into the inductor to generate a positive voltage drop across the inductor.

24. The method of claim 22, the large voltage pulse being a large negative voltage pulse, and the conducting current comprising drawing current through at least one of the plurality of diodes from the inductor to generate a negative voltage drop across the inductor.

25. An apparatus comprising:
means for passing current from a gate of an N-channel metal oxide semiconductor (NMOS) transistor through clamp circuit to an inductor coupled to a source of the NMOS transistor and from the source through the clamp circuit to the gate when a large voltage pulse is applied at the gate of the NMOS transistor; and
means for reducing a gate-to-source voltage (Vgs) of the NMOS transistor by the voltage drop across the inductor.

* * * * *